United States Patent [19]
Frisa et al.

[11] Patent Number: 4,891,525
[45] Date of Patent: Jan. 2, 1990

[54] SKM ION SOURCE

[75] Inventors: Larry E. Frisa; Monroe L. King, both of Austin, Tex.; Stephen E. Sampayan, Livermore, Calif.

[73] Assignee: Eaton Corporation, Cleveland, Ohio

[21] Appl. No.: 271,241

[22] Filed: Nov. 14, 1988

[51] Int. Cl.$^4$ .............................................. H01J 27/00
[52] U.S. Cl. ........................... 250/423 R; 313/231.31; 313/360.1; 250/492.2; 250/492.3; 250/427; 315/111.31; 315/111.81
[58] Field of Search ................... 250/423 R, 424, 426, 250/427, 492.3, 492.2; 313/231.31, 360.1, 362.1, 363.1, 619; 315/111.31, 111.81

[56] References Cited
U.S. PATENT DOCUMENTS

| | | | |
|---|---|---|---|
| 3,846,668 | 11/1974 | Ehlers et al. | 250/423 R |
| 4,139,772 | 2/1979 | Williams | 250/423 R |
| 4,288,716 | 9/1981 | Hinkle et al. | 315/111.81 |
| 4,506,160 | 3/1985 | Sugawara et al. | 250/423 R |
| 4,542,321 | 9/1985 | Singh et al. | 250/423 R |
| 4,608,513 | 8/1986 | Thompson | 313/359.1 |
| 4,760,262 | 7/1988 | Sampayan et al. | 250/423 R |
| 4,800,281 | 1/1989 | Williamson | 250/427 |

FOREIGN PATENT DOCUMENTS

| | | | |
|---|---|---|---|
| 042150 | 3/1983 | Japan | 250/423 R |
| 916703 | 1/1963 | United Kingdom . | |

OTHER PUBLICATIONS

Freeman, "A New Ion Source for Electromagnetics Isotope Separators", Nuclear Instruments and Methods, pp. 306–316, (1963).

Alton, "Aspects of the Physics, Chemistry and Technology of High Intensity Heavy Ion Sources", Nuclear Instruments and Methods, pp. 15–42, (1981).

LaPostolle and Septier, "Linear Accelerators", North Holland Publishing Company, pp. 838–874, (1970).

*Primary Examiner*—Carolyn E. Fields
*Assistant Examiner*—John A. Miller
*Attorney, Agent, or Firm*—F. M. Sajovec

[57] ABSTRACT

An ion source of the side extraction type which includes auxiliary electrodes surrounding the cathode at the ends of the anode, and insulators surrounding the auxiliary electrodes and electrically isolating them from the anode. The auxiliary electrodes essentially define the ends of the discharge chamber, leaving the anode confined to the cylindrical surface surrounding the filament. Each insulator is made up of an inner insulator and an outer insulator with an annular space defined between them. The inner and outer insulators are each in the form of a cylinder with a radially extending flange formed at one end, and interfit with the anode and with each other such that cylindrical spaces are defined between the outer flange portion and the anode and between the inner and outer flange portions. These and other features contribute to improve the electrical isolation between the auxiliary electrode and the anode, prolong source life, and improve beam purity.

14 Claims, 3 Drawing Sheets

SKM ION SOURCE

The present invention relates generally to ion sources, and particularly to an ion source of the type in which an element or compound of the material of a desired ion is dissociated and ionized in a plasma discharge process for use in an ion implantation apparatus. The ions are extracted from the source by means of electric extraction fields to provide a beam of charged particles. The beam includes the desired ions which are subsequently separated from the beam by mass-charge separation techniques.

A problem common to such ion sources is in fully controlling the dissociation process, the result being that the proportion of the desired ion in the output current is generally significantly less than what would appear to be possible. This phenomenon is particularly prevalent if singly charged boron ions are desired from a source gas of a compound of boron, since some compounds of boron are particularly difficult to break down. Accordingly, the total quantity of boron in the desired ionic form has, heretofore, been significantly less than the total quantity of boron present in the gas.

Plasma dissociation ion sources rely on electron impact of uncharged gaseous material to produce a plasma. A commonly used electron impact ion source is a type of side-extraction hot cathode source which comprises a single rod type filament cathode placed within a cylindrically shaped anode, with the axes of the filament cathode and cylindrical anode parallel to each other. An externally applied magnetic field parallel to these axes is also applied to help constrain the motion of the ionizing electrons. Gaseous material which is to be ionized is admitted through a penetration in the anode wall.

To ionize the gaseous material, a potential difference is established between the cathode filament and the cylindrical anode. This electrical field is used to impart radial velocity and therefore energy to the electrons thermoionically emitted from the cathode filament. If the electrons can gain enough energy for ionizing collisions to result a plasma will be established. Positive ions created within the plasma can then be extracted through a narrow longitudinal slit in the anode wall.

Extraction of the positive ions is done by placing an electrode which is negatively biased with respect to the anode electrode external to the plasma and coincident with the longitudinal slit plane. This electrode establishes an electric field with the anode which interacts with the plasma boundary and accelerates the positive ions from the plasma.

It is theorized that the efficiency of a given ion source is highly dependent upon the density and temperature of the ionizing electrons. In addition, the ionizing electrons must be made to traverse relatively long path lengths within the plasma so that there is an increased probability of collision with a neutral gas particle. In the above described source this is accomplished by the combined effects of the magnetic field resulting from the current used to heat the filament and the externally applied magnetic field.

It can be further theorized that for sufficient filament currents, charged particles will have different radial drift velocities at different radial distances from the filament cathode. Charged particles close to the filament will have a net drift velocity directed toward the positive side of the filament cathode and azimuthally with respect to the filament axis at increased radial distances. Thus, most electrons are constrained from reaching the anode by a direct radial drift mechanism and are forced to traverse long path lengths. There is, however, an inherent net drift of electrons toward the positive side of the filament. Those electrons which reach the axial end of the anode are collected by the anode and thus removed from the plasma, resulting in a yield of ions which is lower than expected. As noted above, such low yield is particularly noticeable when singly charged boron ions ($B^+$) are desired. A common source material for boron is boron trifluoride ($BF_3$), which is a gaseous material at room temperature, elemental boron not being used because of its high vaporization temperature. Analysis of ion beams produced using this source material reveals the presence of the desired boron ions, but also such ions as $BF^+$ and $BF_2^+$ with the percentage of the singly charged boron ions being relatively low, typically less than 15%.

In certain prior art systems, this electron leakage is reduced by placing metallic electron reflectors at each end of the filament cathode. These metallic reflectors are used to perturb the cathode/anode electric field so as to redirect the electrons to the center of the discharge. Another prior art method is to increase the magnetic field at each end of the filament. The increased magnetic field acts to reflect electrons back to the discharge similar to the way in which the reflectors function.

In U.S. Pat. No. 4,760,262 which is assigned to the assignee herein, and which is incorporated herein by reference, there is disclosed an ion source wherein the plasma temperature and the uniformity of the extracted ion beam current density in a direction parallel to the slit is increased by placing electrodes which are electrically isolated from the filament at each end of the cylindrical anode. In accordance with various embodiments of that invention potentials are applied to the auxiliary electrodes, by shorting them together to establish identical potentials at each end of the plasma or by other means of connection.

Although the incorporation of such auxiliary electrodes represents a significant improvement over prior art ion sources, it has been discovered that other improvements can be made which will further enhance the performance of such sources, particularly in the area of improved insulator performance, enhanced ionization, prolonged source life and improved beam purity.

In accordance with the present invention, certain of the above objectives are accomplished by making the insulator between the auxiliary electrode and the anode in two parts with spaces formed between adjacent components to thereby greatly increase the path length for the formation of a conductive coating on the insulator surface. By minimizing the size of the gaps the acceptance angles from the discharge chamber to the insulator walls are minimized. By providing additional cylindrical gaps between the insulator elements and the anode and between the separate parts of the insulator the line of sight from the chamber to the inner insulator surfaces is minimized thus inhibiting the buildup of a conductive coating on these surfaces.

Further in accordance with the invention, spaces are formed between the filament insulator and the auxiliary electrode which serve to eliminate shorting. These spaces, in combination with a counterbore in the end of the filament insulator in which the filament is received, result in the end of the filament insulator having decreased mass, which increases the temperature of the end of the insulator due to filament heating, thus inhibiting condensation of sputtered material.

Also in accordance with the invention, the auxiliary electrodes are quite large in relation to the inside diameter of the anode such that the auxiliary electrodes essentially define the ends of the discharge region. By defining the ends of discharge region by the auxiliary electrodes rather than by anode walls, the electron flux from the plasma as well as electrons which tend to drift along the filament are redirected back into the plasma rather than being collected by the anode walls. This results in increased electron density within the discharge region and thus enhances ionization.

Other improvements include mounting the auxiliary electrode insulators in counterbores formed in the anode to further minimize the solid angle acceptance of material from the discharge chamber to the insulator walls and provide additional line-of-sight shielding, and radiusing the edges of the anode nearest the auxiliary electrode to inhibit sporadic arcing between the auxiliary electrode and the anode.

It has also been determined that the proper choice of materials is important to the optimization of the performance of the improved source. Thus it is considered to be important to use materials which do not compete with the desired ion beam and/or are compatible with the localized high temperatures found in the source. More specifically, in the preferred embodiment of the invention the insulators are fabricated of boron nitride, and the auxiliary electrodes as well as the anode are preferably fabricated of molybdenum. In situations wherein boron nitride and associated reaction products result in an ion which equals or is near to the magnetic rigidity of the desired ion, and/or where the space charge at the extraction slit is not critical, alumina can also be used as the insulator material.

Other objectives and advantages of the invention will become apparent from the following description when considered in connection with the accompanying drawings, wherein;

FIG. 1. is an end elevation view of an ion source constructed in accordance with the present invention;

Figure 1:
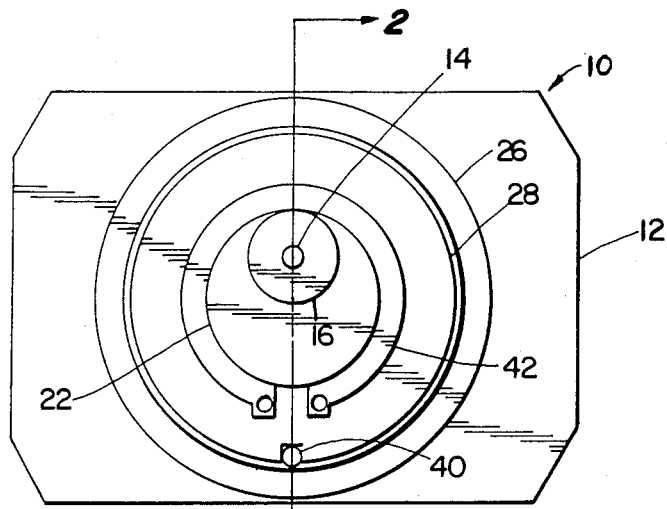
Figure 2:
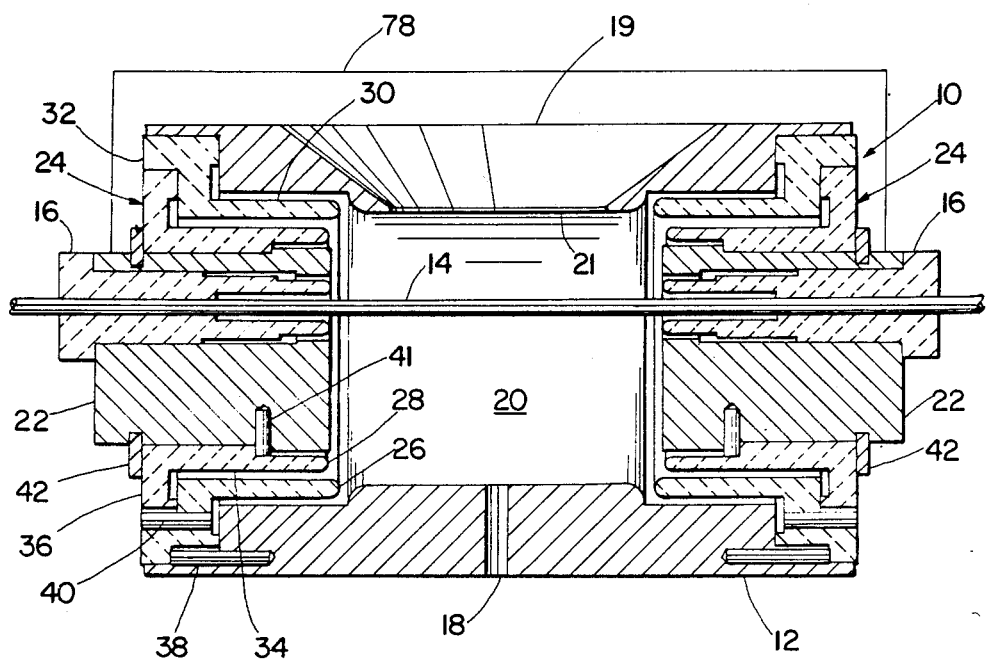
FIG. 2 is a section view taken along line 2—2 of FIG. 1.

Referring to FIGS. 1 and 2, there is illustrated an ion source 10 of the type described in the aforementioned U.S. Pat. No. 4,760,262, comprising a generally cylindrical anode 12 with an axially extending cathode filament 14 supported within the anode structure by filament insulators 16. In the preferred embodiment the anode is formed of a generally rectangular block with a cylindrical through bore 21 and a plurality of counterbores formed therein.

As is well-known in the art, a gaseous element or compound of the desired ionic material is caused to flow into the anode cylinder through an inlet 18. A D.C. voltaqe potential is established between the anode and the cathode of sufficient amplitude to cause a discharge of electrons through the gas between the cathode and the anode, which causes a dissociation of the gas into various neutral and charged particles. The neutral particles exit as part of the gas flow through an exit slit 19.

The charged particles, both positive and negative fill the discharge chamber 20 within the anode. Positively charged particles which drift close to the slit are extracted from the anode by means of an extraction electrode (not shown) outside the anode and are accelerated in a known manner to provide a beam of charged particles.

The filament insulators 16 are mounted within cylindrical auxiliary electrodes 22 which are in turn mounted within second insulator assemblies designated generally by the numeral 24. The insulators 16 and 24, and the auxiliary electrodes 22 on both sides of the anode are identical and only one set will be described herein in detail.

In accordance with the invention each of the insulator assemblies 24 is formed of two members 26 and 28. The outer member 26 is received in the end of the anode as will be described in more detail later, and comprises a cylindrical portion 30 coaxial with the filament 14 and a flange portion 32. The inner insulator member 28 comprises a cylindrical portion 34, which is spaced inwardly from the outer cylindrical portion 30 and a flange portion 36 which is received in a counterbore formed in the flange portion 32 of member 26.

The electrode and insulator structures shown in FIG. 2 are maintained in axial position relative to the anode by a source mounting structure (not shown) within the ion implanter in which the source is installed. The angular position of the outer insulator 26 is maintained by means of a pin 38 received in a hole formed in the end of the anode 12 and engaging an axial slot formed in the outer periphery of the insulator. The angular position of the inner insulator 28 is maintained by a pin 40 received in a hole formed in the flange portion 32 of the outer insulator and engaging a slot formed in the outer periphery of the flange portion 36 of the inner insulator. The radial position of the auxiliary electrode 22 is maintained by means of a pin 41 received in a radial hole formed in the electrodes and engaging an axial slot formed in the cylindrical portion 34 of the inner insulator 28.

The auxiliary electrode 22 is constrained from moving axially inward into the space 20 by means of a snap ring 42 received in an annular groove formed in the outer periphery of the electrode and engaging the outer end of the inner insulator 28.

Figure 3:
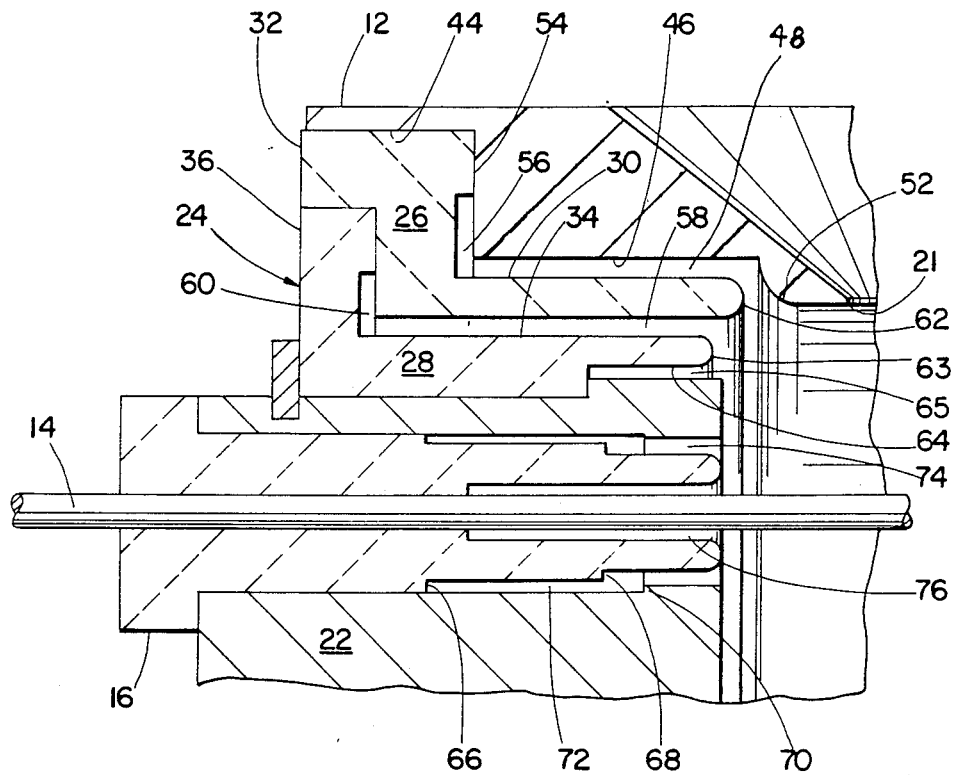
FIG. 3 is an enlarged, fragmentary cross-sectional view of a portion of the ion source.

FIG. 3 is an enlarged view of a portion of the upper left quadrant of FIG. 2. Referring thereto, the outer member 26 of the insulator assembly 24 is closely received within a first counterbore 44 formed in the anode 12. The cylindrical portion 30 is received within a second counterbore 46; however, in accordance with the invention an annular space 48 is left between the counterbore diameter and the outer diameter of the cylindrical portion. The counterbore 46 is somewhat greater in diameter than the inner diameter 21 of the anode, and the intersection between the two diameters is formed as a radius 52, which is not critical in value but preferably equal to the difference between the radius of the counterbore 46 and the bore 21.

As viewed in FIG. 3, the face 54 of the member 26 rests against the bottom of counterbore 44; however, an annular recess is formed in the face 54 to define a cylindrical space 56 between the flange 32 and the anode 12.

The relationship between the inner insulator 28 and the outer insulator 26 is similar to that described above in relation to the outer insulator 26 and the anode 12, with the flange portion 36 being closely received within a counterbore formed in the end of insulator 26, and the relationship between the outer diameter of the cylindrical portion 34 and the inner diameter of the cylindrical portion 30 being such that an annular space 58 is defined between the cylindrical portions. A cylindrical space 60, similar to the space 56, is formed between the flange portion 32 and the flange portion 36. The cylindrical ends of the insulators 26 and 28 facing into the interior of the anode are rounded as shown at 62 and 63 respectively.

The auxiliary electrode 22 is formed with a portion of increased diameter received within a counterbore 64 formed in the inner end of insulator 28, such that a space 65 is defined between the electrode and the insulator. The auxiliary electrode is sized such that it and the insulators 16, 26, 28, define the end wall of the discharge chamber, such that there is no anode area at the ends of the discharge chamber. In the embodiment illustrated herein the surface area of the electrode facing the discharge chamber makes up about fifty percent of the end wall area, and it is estimated that for satisfactory performance this area should make up at least 25% of the end wall area, the rest being defined by the insulators.

The filament insulator 16 has an outer diameter which is stepped down at 66 and again at 68, while the inner diameter of the auxiliary electrode 22 is reduced at 70 to define a first annular space 72 and a second annular space 74 between the insulator 16 and the auxiliary electrode 22. The inner end of the insulator 16 is counterbored to form an annular space 76 between the insulator and the filament 14 as shown in U.S. Pat. No. 4,760,262.

As noted above, the insulators 16 and 24 are preferably fabricated of boron nitride, while the auxiliary electrodes 22 and the anode 12 are preferably molybdenum.

Figure 4:
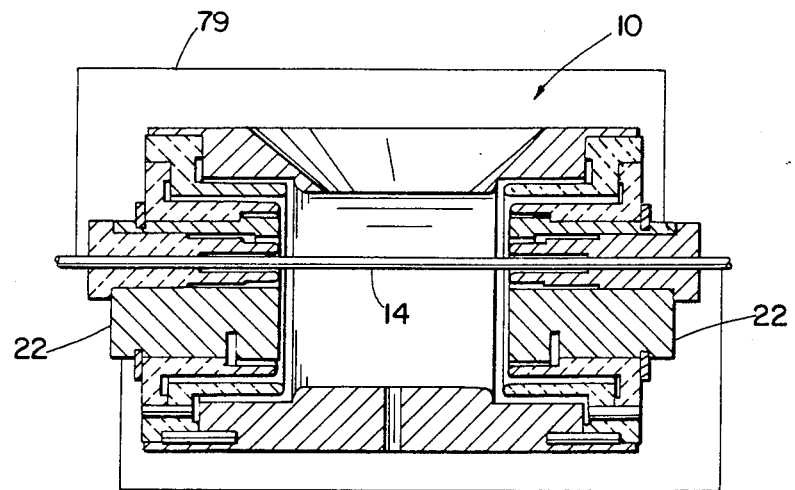
FIGS. 4-6 are schematic views of the present invention illustrating various means for applying potentials to the auxiliary electrodes.
Figure 5:
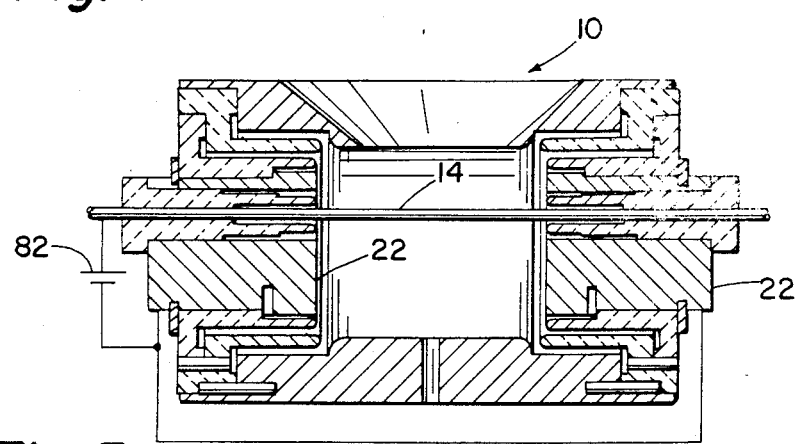
Figure 6:
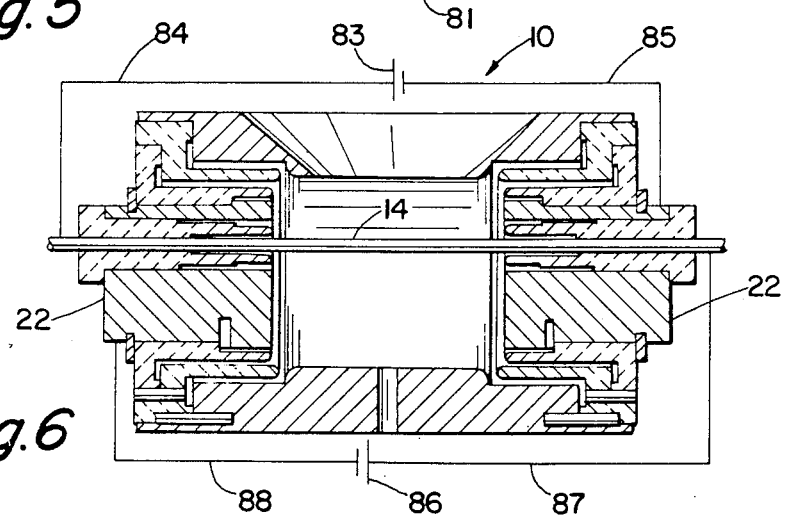

The general operation of the improved source is substantially the same as that of prior sources, including the source described in U.S. Pat. No. 4,760,262 and will not be described herein in detail; however, it should be appreciated that as in the above patent the auxiliary electrodes 22 can be connected in a number of different ways. More specifically, FIG. 2 shows the auxiliary electrodes connected together by means of line 78. FIG. 4 shows the auxiliary electrodes connected to opposite ends of the filament 14. In FIG. 5 the auxiliary electrodes are connected together by line 81, while a source 82 applies a voltage between the filament and the auxiliary electrodes. In FIG. 6 a voltage is applied between one end of filament 14 and the opposite electrode 22 by means of a voltage source 83 and lines 84 and 85, while an equal voltage is applied between the other end of the filament and its opposite electrode by means of a voltage source 86 and lines 87 and 88.

We claim:

1. In an ion source comprising a housing having a cylindrical bore, a cathode extending axially within said housing, first insulator means supporting said cathode within said housing, a first electrode at least a portion of which is proximate to said cathode adjacent one end thereof, a second electrode at least a portion of which is proximate to said cathode adjacent the opposite end thereof, biasing means operable to apply potentials to said first and second electrodes, and second insulator means electrically isolating said first and second electrodes from said cathode and from said housing; the improvement wherein said second insulator means comprises an inner insulator and an outer insulator, said inner and outer insulators being disposed relative to one another to define a space between at least portions thereof.

2. Apparatus as claimed in claim 1, in which said first insulator means, said first and second electrodes, and said second insulator means are arranged on parallel axes and received in the ends of said housing; said first insulator means comprises an elongated cylindrical member in surrounding relation to and engaging said cathode; each of said first and second electrodes comprises a cylindrical member in surrounding relation to said first insulator means; and each of said inner and outer insulators comprises a generally cylindrical member having an axially elongated cylindrical portion and a radially extending flange portion, said space between said inner and outer insulators being defined by an annular space between the cylindrical portion of said inner insulator and the cylindrical portion of said outer insulator.

3. Apparatus as claimed in claim 2, wherein the ends of said housing are counterbored, and said outer insulator is received within the counterbores with the flange portion of the outer insulator is contact with the bottom of the counterbore.

4. Apparatus as claimed in claim 2, wherein each end of the housing is formed with a first counterbore and a second counterbore of greater diameter than the first, and wherein said outer insulator is received within the counterbores with the outer diameter of the flange portion of the outer insulator engaging the diameter of the second counterbore and a face of the flange portion of the outer insulator engaging the bottom of the second counterbore, and the cylindrical portion of the outer insulator being received within but spaced from the diameter of the first counterbore.

5. Apparatus as claimed in claim 4, in which a portion of the face of the flange portion of the outer insulator in contact with the bottom of the second counterbore is recessed to define a cylindrical space between such flange portion and the bottom of the second counterbore.

6. Apparatus as claimed in claim 5, in which the flange portion of said outer insulator is counterbored, the flange portion of said inner insulator being received within the counterbore in said outer insulator with the outer diameter of the flange portion of the inner insulator in engagement with the diameter of the counterbore in said outer insulator and a face of the flange portion of the inner insulator in engagement with the bottom of the counterbore in said outer insulator; a portion of said face being recessed to define a cylindrical space between the flange portion of the inner insulator and the bottom of the counterbore in said outer insulator.

7. Apparatus as claimed in claim 2, in which said inner insulators are counterbored, at least a portion of each of said first and second electrodes is received within such counterbores, and the outer diameter of the portions of said first and second electrodes within the counterbores is less than the diameter of the counterbores to define an annular space between the corresponding portions of said electrodes and said inner insulators.

8. Apparatus as claimed in claim 4 in which the intersection of said cylindrical bore and said first counterbore is formed a radius.

9. Apparatus as claimed in claim 8, in which said radius is substantially equal to the difference between the radius of said cylindrical bore and the radius of said first counterbore.

10. In an ion source comprising a housing having a cylindrical bore defining a plasma discharge chamber, said housing defining an anode; a cathode extending axially within said chamber; first insulator means supporting said cathode within said housing; a first electrode at least a portion of which is proximate to said cathode adjacent one end thereof; a second electrode at least a portion of which is proximate to said cathode adjacent the opposite end thereof; biasing means operable to apply potentials to said first and second electrodes; and second insulator means electrically isolating said first and second electrodes from said cathode and from said housing; the improvement wherein said first and second electrodes and said first and second insulator means define the entire end walls of said plasma discharge chamber, such that no anode area exists at the ends of said discharge chamber.

11. Apparatus as claimed in claim 10 in which said first and second electrodes comprise cylindrical members surrounding said first insulator means, wherein the surface area of the end of each of said electrodes facing said chamber makes up at least twenty five percent of the surface area of each of said end walls.

12. Apparatus as claimed in any one of said claims 1 through 11 in which said first and second insulator means are fabricated of boron nitride.

13. Apparatus as claimed in any one of claims 1 through 13 in which said first and second insulator means are fabricated of alumina.

14. Apparatus as claimed in any one of claims 1 through 11 in which said first and second electrodes are fabricated of molybdenum.

* * * * *